United States Patent [19]

Kasai

[11] Patent Number: 5,910,674
[45] Date of Patent: Jun. 8, 1999

[54] SEMICONDUCTOR INTEGRATED CIRCUIT DEVICE AND METHOD OF FABRICATING THE SAME

[75] Inventor: Yoshio Kasai, Itami, Japan

[73] Assignee: Mitsubishi Denki Kabushiki Kaisha, Tokyo, Japan

[21] Appl. No.: 08/857,467

[22] Filed: May 16, 1997

Related U.S. Application Data

[63] Continuation of application No. 08/662,951, Jun. 13, 1996, abandoned, which is a continuation of application No. 08/455,165, May 31, 1995, abandoned.

[30] Foreign Application Priority Data

Aug. 29, 1994 [JP] Japan ................................. 6-204023

[51] Int. Cl.⁶ ........................... H01L 29/76; H01L 29/94; H01L 31/062; H01L 31/113
[52] U.S. Cl. ........................................... 257/369; 257/370
[58] Field of Search ..................................... 257/369, 370

[56] References Cited

U.S. PATENT DOCUMENTS

| 5,239,197 | 8/1993 | Yamamoto ............................. 257/369 |
| 5,323,043 | 6/1994 | Kimura et al. .......................... 257/372 |
| 5,362,981 | 11/1994 | Sato et al. ............................. 257/372 |
| 5,491,358 | 2/1996 | Miyata et al. .......................... 257/372 |

FOREIGN PATENT DOCUMENTS

| 57-149765 | 2/1982 | Japan . |
| 57-211741 | 12/1982 | Japan . |
| 59-117148 | 7/1984 | Japan . |
| 1-51649 | 2/1989 | Japan . |
| 2-153562 | 6/1990 | Japan . |
| 3-32052 | 2/1991 | Japan . |

OTHER PUBLICATIONS

Muller et al, Device Electronics for Ic's, p. 463, 1986.

*Primary Examiner*—Stephen D. Meier
*Attorney, Agent, or Firm*—McDermott, Will & Emery

[57] ABSTRACT

A semiconductor integrated circuit device wherein a semiconductor layer of a second conductivity type is formed at a region excluding a region where a semiconductor element of the second conductivity type is formed, or at a region having an adequate area in a semiconductor substrate of a first conductivity type, a semiconductor element of the first conductivity type is formed in the semiconductor layer of the second conductivity type, and a semiconductor element of the second conductivity type is formed at the region where the semiconductor layer of the second conductivity type is not formed, and a method of fabricating the device.

2 Claims, 8 Drawing Sheets

SEMICONDUCTOR INTEGRATED CIRCUIT DEVICE AND METHOD OF FABRICATING THE SAME

This application is a continuation of application Ser. No. 08/662,951 filed Jun. 13, 1996 now abandoned which is a continuation of application Ser. No. 08/455,165, filed May 31, 1995 now abandoned.

BACKGROUND OF THE INVENTION

1. Field of the Invention

The invention relates to a semiconductor integrated circuit device in which semiconductor circuits consisting of CMOS elements and the like are integrated, and also to a method of fabricating the device.

2. Description of Related Art

FIG. 1 is a view showing a layout of a conventional semiconductor integrated circuit device in which a CMOS inverter is formed on a semiconductor substrate, and FIG. 2 is a sectional view taken along line II—II in FIG. 1. In the figures, numeral 1 designates a P-type semiconductor substrate, and an N-well 2 is formed in a region of the P-type semiconductor substrate 1 where a P-channel transistor 21 is to be formed. An N-type diffusion layer 10 which is for the efficient connection of a Vcc conductor 3 formed thereon with the N-well 2, is formed in the left portion of the N-well 2 in FIG. 2. A P-type diffusion layer 5 of the P-channel transistor 21 is formed on the right of the N-type diffusion layer 10.

In FIG. 2, an N-type diffusion layer 6 of an N-channel transistor 22 is formed at an appropriate position of the P-type semiconductor substrate 1 where the N-well 2 is not formed. A P-type diffusion layer 11, which is for the efficient connection of a Vss conductor 4 formed thereon with the P-type semiconductor substrate 1, is formed on the right of the N-type diffusion layer 6. An insulating film 16 is formed in surface regions where the N-type diffusion layer 10, the P-type diffusion layer 5, the N-type diffusion layer 6, and the P-type diffusion layer 11 are not formed. An insulating layer 15 is formed on the insulating film 16. The Vcc conductor 3 is connected to the N-type diffusion layer 10 and the P-type diffusion layer 5 through the contact holes 9. The Vss conductor 4 is connected to the N-type diffusion layer 6 and the P-type diffusion layer 11 through the contact holes 9.

In FIG. 1, the reference numeral 7 designates a gate for the P-channel transistor 21 and the N-channel transistor 22. The gate is made of polysilicon. The reference numeral 8 designates an output conductor for connecting both drains of the P-channel transistor 21 and the N-channel transistor 22. The output conductor is made of aluminum. Both of the drain regions are connected to the output conductor 8 through contact holes 9.

A method of fabricating the conventional semiconductor integrated circuit device thus configured will be described. First, in a design process, N-well data are previously input as the design data into the region where the P-channel transistor 21 is to be formed, and a mask, for forming the N-well 2 in the portion where the N-well data exist, is fabricated. The N-well 2 is then formed using the mask. Thereafter, conventional fabrication processes are conducted to fabricate the P-channel transistor 21 in the region where the P-channel transistor 21 is to be formed and the N-well 2 is formed, and the N-channel transistor 22 is fabricated in the region where the N-channel transistor 22 is to be formed and the N-well 2 is not formed.

FIG. 3 is a sectional view showing the structure of another conventional semiconductor integrated circuit device which has the PN double well structure. In a low-concentration P-type semiconductor substrate 19, the N-well 2 is formed in the region where a P-channel transistor 21 is to be formed, and a P-well 18 in the region where the N-channel transistor 22 is to be formed. The other portions are configured in the same manner as those of FIG. 2.

In the thus configured semiconductor integrated circuit device, N-well data are previously input as the design data into the region where the P-channel transistor 21 is to be formed, and P-well data are previously input as the design data into the region where the N-channel transistor 22 is to be formed. The N-well 2 and the P-well 18 are formed on the basis of these deign data. In the same manner as the case described above, thereafter, elements are fabricated by conventional fabrication processes.

In the conventional semiconductor integrated circuit device mentioned above, the N-well 2 is formed only in the region of the P-type semiconductor substrate 1 where the P-channel transistor 21 is to be formed, and an inverter is formed which has the P-channel transistor 21 and the N-channel transistor 22 between Vcc and Vss. In this case, the N-well 2 is formed only in a part of the P-type semiconductor substrate 1 (for example, ¼ to ⅓ of the substrate), and hence the junction area is small, and so is the PN junction capacitance 17 between the P-type semiconductor substrate 1 and the N-well 2.

When a noise is fabricated in the Vcc conductor 3 or the Vss conductor 4 of the semiconductor integrated circuit device having the small PN junction capacitance 17, the potential variation of the Vcc conductor 3 or the Vss conductor 4 is hardly absorbed so that a malfunction easily occurs in the circuits. Such a phenomenon appears not only in the N-well system shown in FIGS. 1 and 2 but also in the P, N double well system shown in FIG. 3.

Known techniques to solve the problem mentioned above include the followings:

Japanese Patent Application Laid-Open No. 57-211741 (1982) discloses a semiconductor device wherein a semiconductor region of a conductivity type opposite to that of a semiconductor substrate is formed immediately under a bonding pad in order to form a parasitic capacitance for suppressing a noise level.

Japanese Patent Application Laid-Open No. 59-117148 (1984) discloses a semiconductor integrated circuit device wherein a power supply conductor is connected to a semiconductor substrate and also to a semiconductor region which forms a PN junction with the semiconductor substrate, thereby reducing an influence of a noise.

Japanese Patent Application Laid-Open No. 3-32052 (1991) discloses a semiconductor integrated circuit device wherein a diffusion capacitance between a source/drain diffusion region and a well diffusion region is formed in the conductor regions and the diffusion capacitance is connected to a power supply conductor or a ground conductor, whereby a noise is relaxed and a circuit is prevented from malfunctioning.

Japanese Patent Application laid-Open No. 2-153562 (1990) discloses a CMOS integrated circuit wherein, an N-type (or P-type) diffusion layer which is selectively formed in a P-type (or N-type) semiconductor substrate and is connected to a power supply conductor or a ground conductor, or a P-type (or N-type) diffusion layer which is selectively formed in a N-type (or P-type) well and is connected to the power supply conductor or the ground conductor, is disposed in a conductor region in order to reduce an influence of a noise appearing in the power supply conductor or the ground conductor.

SUMMARY OF THE INVENTION

The invention has been devised in order to solve the above-mentioned problem. It is a primary object of the invention to provide a semiconductor integrated circuit device and a method of fabricating the device, which obtains a sufficient junction capacitance, by the formation of a semiconductor layer of a second conductivity type is formed in a whole region of, or in a region having an adequate area of a semiconductor substrate of a first conductivity type excluding a region where a semiconductor element of the second conductivity type is to be formed.

The semiconductor integrated circuit device according to the invention is characterized in comprising a semiconductor layer of a second conductivity type formed in a partial or whole region of a semiconductor substrate of a first conductivity type excluding a region where a semiconductor element of the second conductivity type is to be formed. In the case where the semiconductor layer of the second conductivity type is formed in the whole region excluding the region where the semiconductor element of the second conductivity type is to be formed, the junction area between the semiconductor substrate of the first conductivity type and the semiconductor layer of the second conductivity type is much larger than that obtained in the prior art, thereby increasing the junction capacitance. When the semiconductor layer of the second conductivity type is formed in a part of the region excluding the region where the semiconductor element of the second conductivity type, the power consumption can be reduced as compared with the above-mentioned case. The area is set to be within a range where a desired junction capacitance can be obtained and the device can operate with a power consumption in a predetermined range.

In the case where semiconductor elements of the first and second conductivity types are N-channel and P-channel field effect transistors, the above functions can be realized by, for example, a CMOS semiconductor integrated circuit device.

The method of fabricating a semiconductor integrated circuit device according to the invention is characterized in that a semiconductor layer of a second conductivity type is formed in a whole region of a semiconductor substrate of a first conductivity type excluding a region where a semiconductor element of the second conductivity type is to be formed. This can fabricate a semiconductor integrated circuit device having a large junction capacitance.

The method of fabricating a semiconductor integrated circuit device according to the invention is characterized in that a specific region defining an outer boundary of a semiconductor layer of a second conductivity type is set, and that the semiconductor layer of the second conductivity type is formed in the region excluding a region where a semiconductor element of the second conductivity type is to be formed within the specified region in a region of a semiconductor substrate of a first conductivity type. When the area of a portion of the specific region, excluding the region where the semiconductor element of the second conductivity type is to be formed, is set so that a desired junction capacitance is obtained and that the increase of the power consumption due to the increase of the junction area is within an allowable range, it is possible to fabricate a semiconductor integrated circuit device in which the noise level and the power consumption are kept within a predetermined range.

The above and further objects and features of the invention will more fully be apparent from the following detailed description with accompanying drawings.

DESCRIPTION OF THE PREFERRED EMBODIMENTS

Hereinafter, the invention will be described in detail with reference to the drawings showing its embodiments.

Embodiment 1

Figure 4:
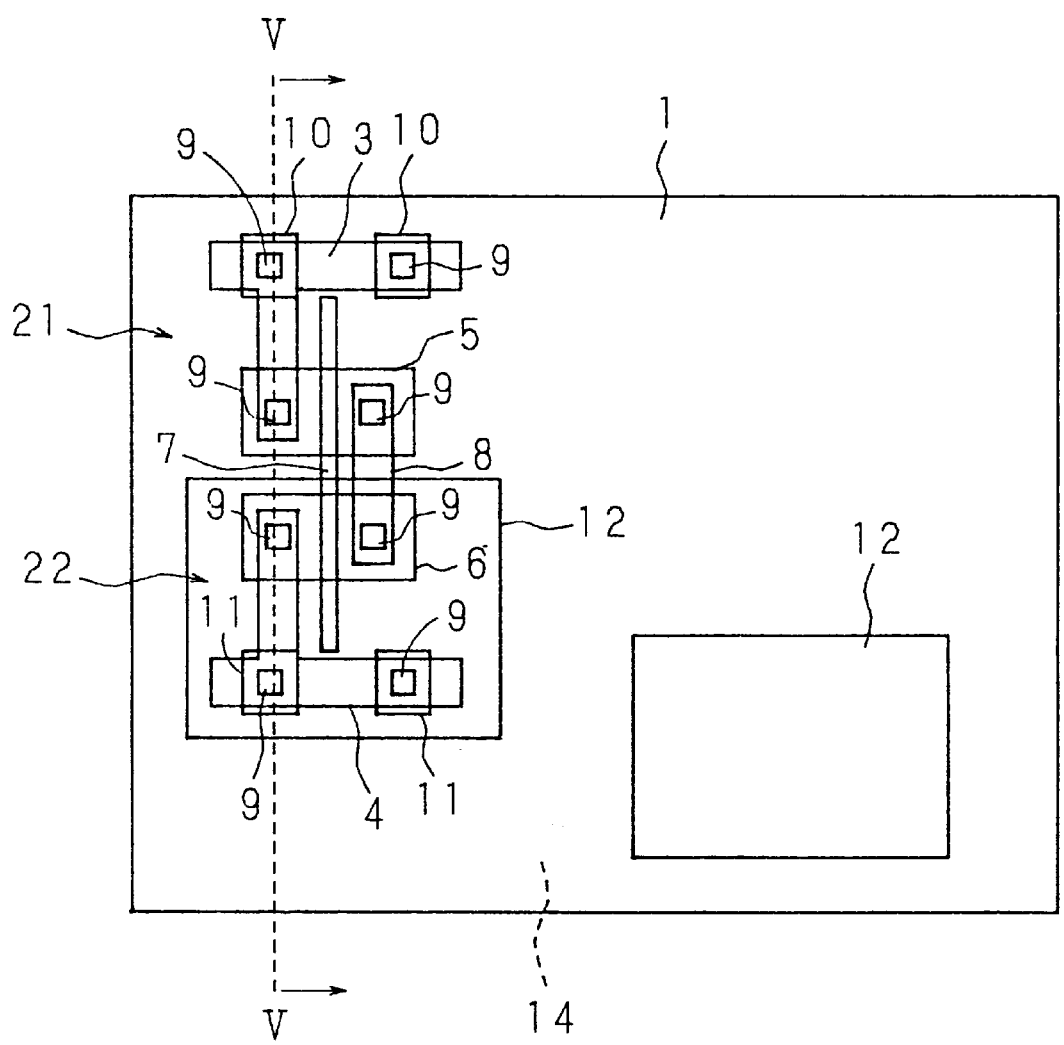
FIG. 4 is a view showing a layout of a semiconductor integrated circuit device of Embodiment 1 of the invention.
Figure 5:
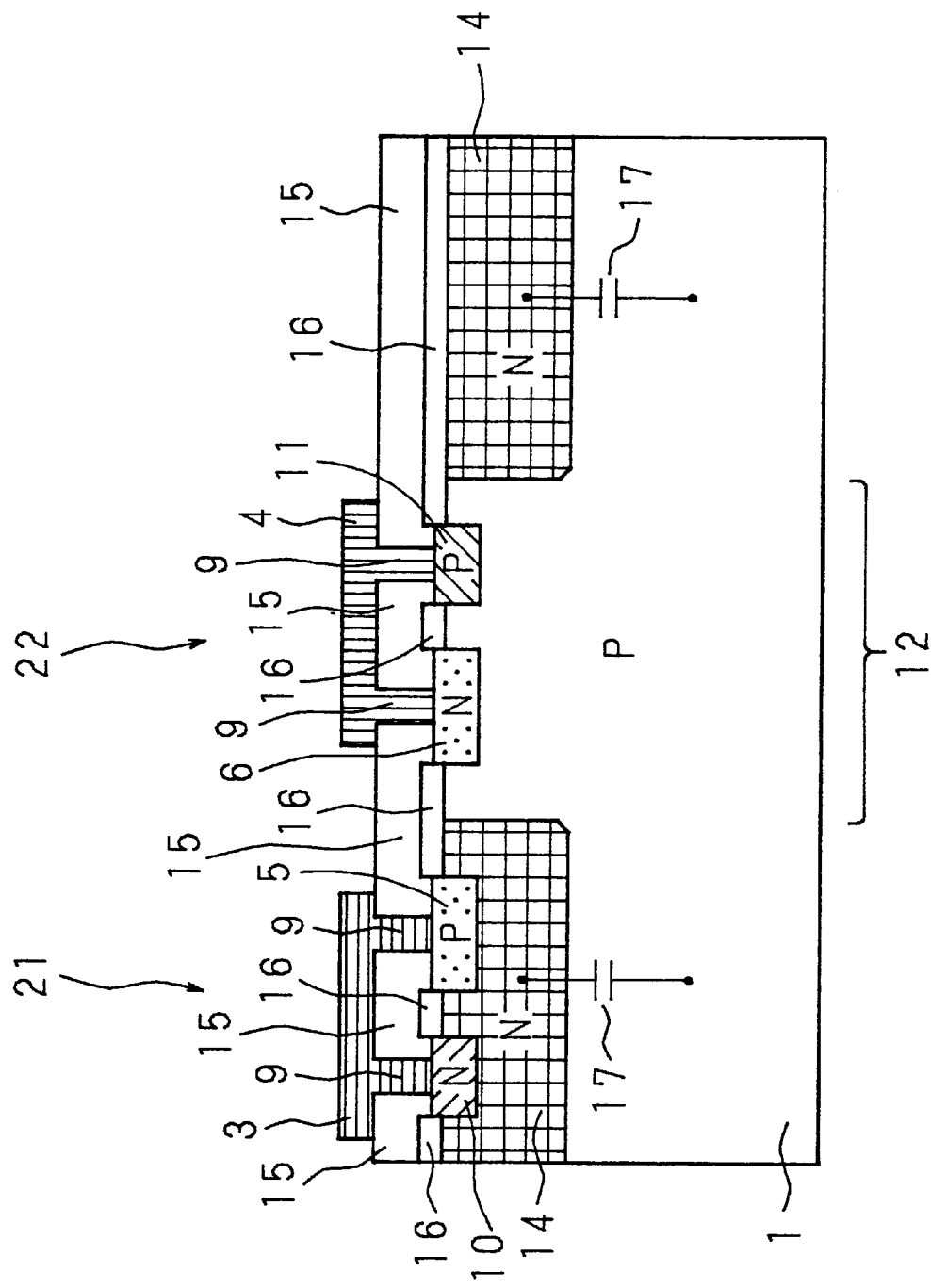
FIG. 5 is a sectional view taken along line V—V in FIG. 4.

FIG. 4 is a view showing a layout of a semiconductor integrated circuit device of Embodiment 1 of the invention, and FIG. 5 is a sectional view taken along line V—V in FIG. 4. In the figures, numeral 1 designates a P-type semiconductor substrate, and a region where an N-channel transistor 22 is to be formed on the P-type semiconductor substrate 1 is designated as a P-type substrate region 12. N-wells 14 are formed in a region excluding the P-type substrate region 12. An N-type diffusion layer 10 for efficiently connecting a Vcc conductor 3 formed thereon to the left N-well 14 in FIG. 5 is formed in the left portion of the left N-well 14. A P-type diffusion layer 5 of the P-channel transistor 21 is formed on the right of the N-type diffusion layer 10.

In FIG. 5, an N-type diffusion layer 6 of the N-channel transistor 22 is formed at an appropriate position of the P-type semiconductor substrate 1 where the N-wells 14 are not formed. A P-type diffusion layer 11 for efficiently connecting a Vss conductor 4 formed thereon to the P-type semiconductor substrate 1 is formed on the right of the layer 6. An insulating film 16 is formed in surface regions where the N-type diffusion layer 10, the P-type diffusion layer 5, the N-type diffusion layer 6, and the P-type diffusion layer 11 are not formed. An insulating layer 15 is formed on the insulating film 16. The Vcc conductor 3 is connected to the N-type diffusion layer 10 and the P-type diffusion layer 5 through contact holes 9. The Vss conductor 4 is connected to the N-type diffusion layer 6 and the P-type diffusion layer 11 through contact holes 9.

In FIG. 4, the reference numeral 7 designates a gate for the P-channel transistor 21 and the N-channel transistor 22. The gate is made of polysilicon. The reference numeral 8 designates an output conductor for connecting the drains of the P-channel transistor 21 and the N-channel transistor 22. The output conductor is made of aluminum. Both drain regions are connected to the output conductor 8 through contact holes 9.

A method of fabricating the semiconductor integrated circuit device having the above configuration will be described. In a pattern design process, design data for designating the region where the N-channel transistor 22 is to be formed as the P-type substrate region 12 are input. In the fabrication of masks, a graphic calculation is first performed so as to exclude data for the P-type substrate region 12 from the whole region of the semiconductor integrated circuit device. A mask for forming the N-wells 14 is fabricated with using the data obtained by the graphic calculation, i.e., all data for the region where there exists no data for the P-type substrate region 12. The other masks are fabricated on the basis of the same design data as those of the prior art.

Then, the N-wells 14 are formed in the P-type semiconductor substrate 1 by the ion implantation method using the mask for forming the N-wells 14. The insulating film 16 is then formed by the thermal oxidation method at appropriate positions for isolating the N-type diffusion layer 10, the P-type diffusion layer 5, the N-type diffusion layer 6, and the P-type diffusion layer 11 from each other. A P-type impurity (B: boron) is diffused by the ion implantation method in portions in which the insulating film 16 is not formed and which are to be of the P type, and an N-type impurity (P: phosphorus) is diffused in portions which are to be of the N type. Thereafter, the insulating layer 15 is formed over the whole surface, and the contact holes 9 are formed above the N-type diffusion layer 10, the P-type diffusion layer 5, the N-type diffusion layer 6, and the P-type diffusion layer 11. The Vcc conductor 3 is formed at an appropriate position of the region where the P-channel transistor 21 is to be formed, by operating aluminum deposition and etching. The Vss conductor 4 is formed at an appropriate position of the region where the N-channel transistor 22 is to be formed in the similar operation.

As described above, the semiconductor integrated circuit device of the invention can be designed in the same manner as the conventional manner only by adding a graphic process which is performed in the process of fabricating masks for forming a well, and then fabricated by strictly the same fabrication processes as those of the prior art.

Figure 1:
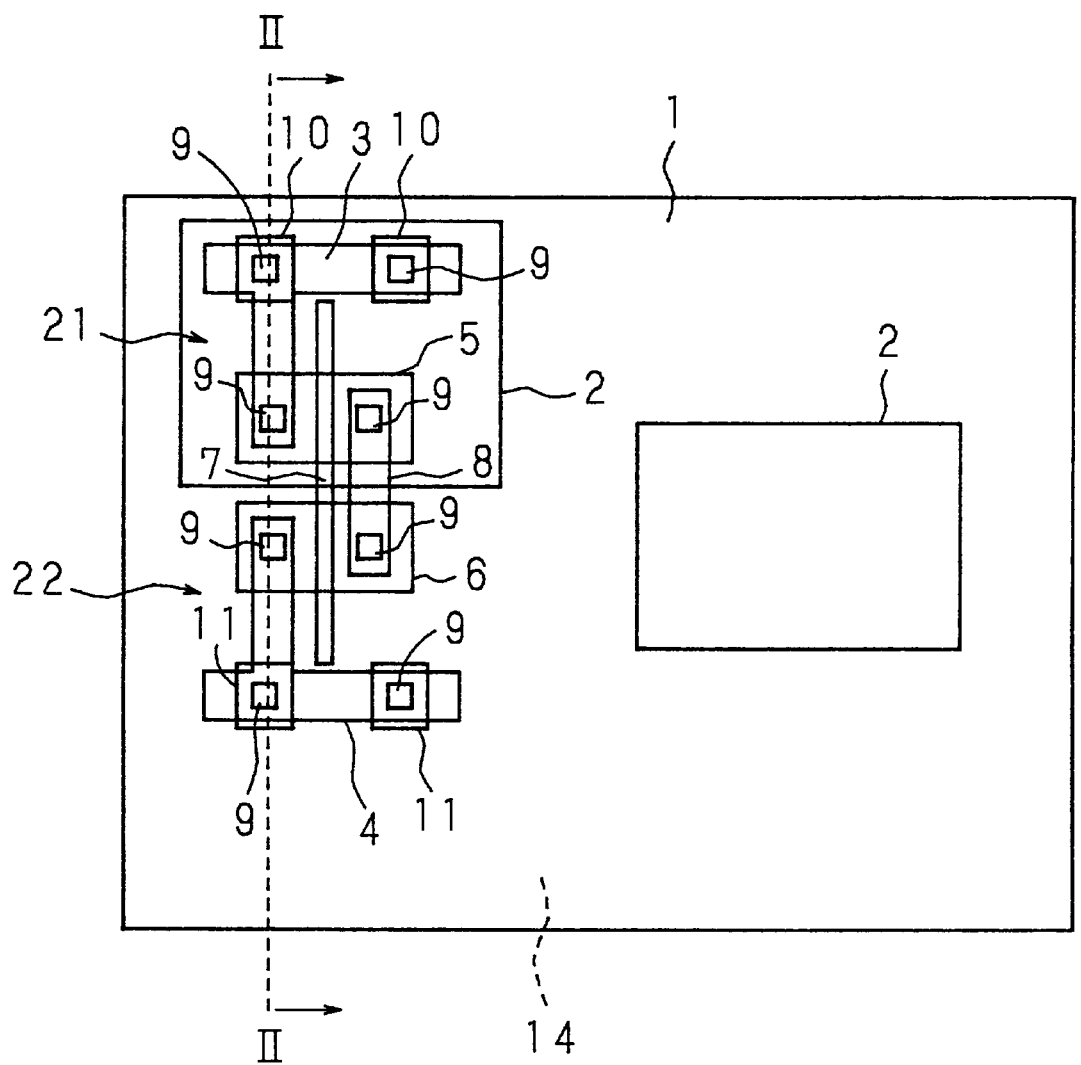
FIG. 1 is a view showing a layout of a conventional semiconductor integrated circuit device in which a CMOS inverter is formed on a semiconductor substrate.
Figure 2:
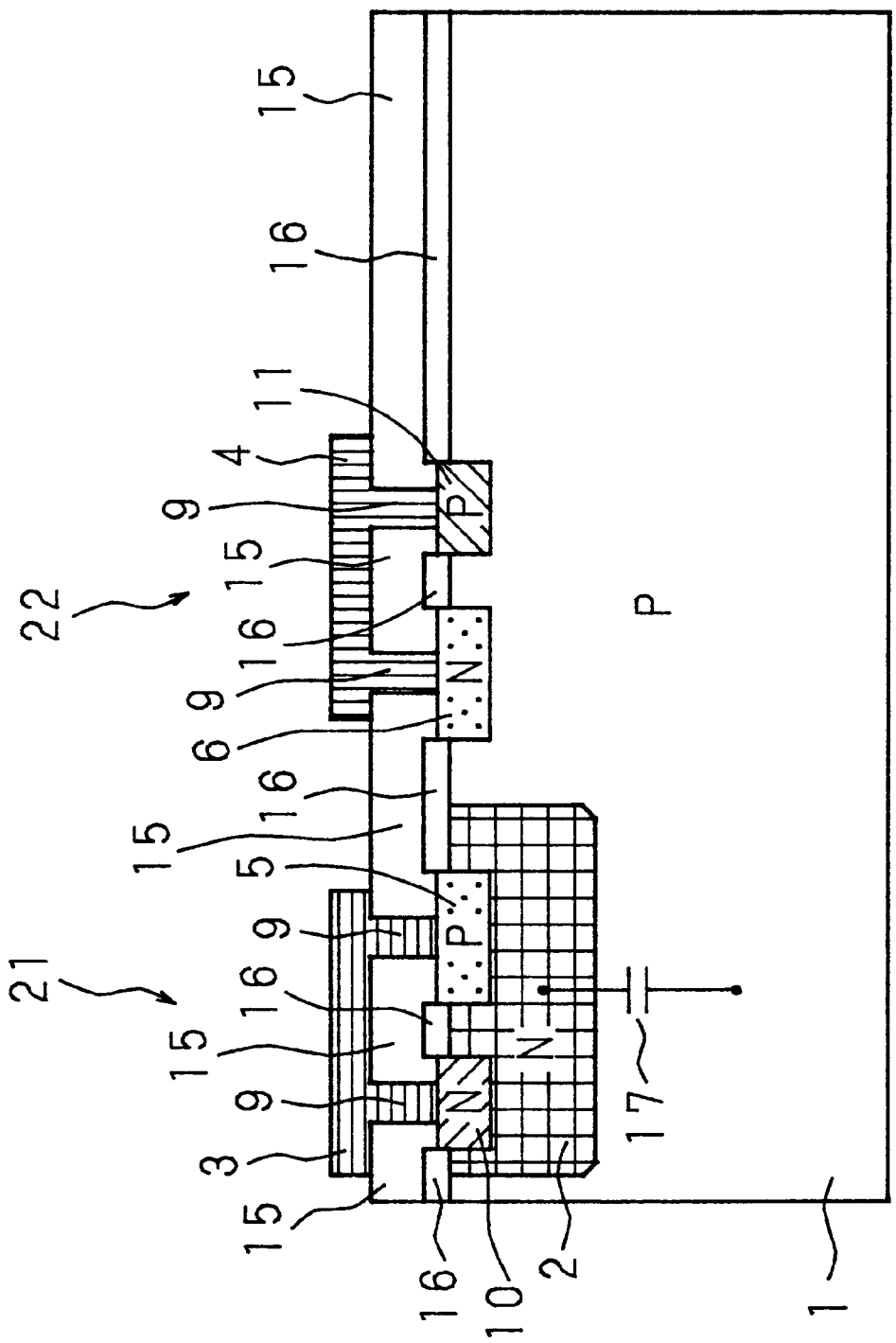
FIG. 2 is a sectional view taken along line II—II in FIG. 1.
Figure 3:
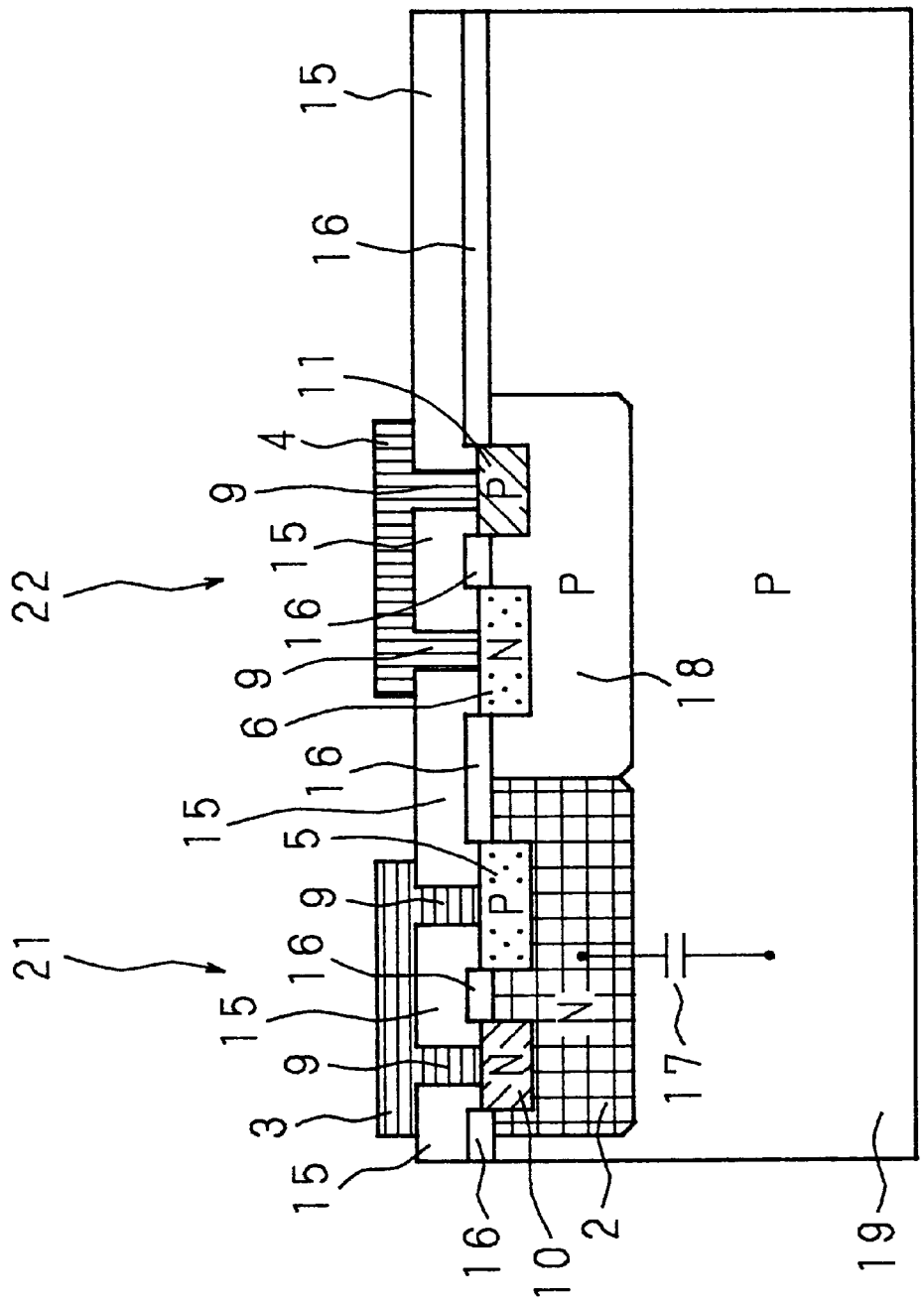
FIG. 3 is a sectional view showing the structure of a conventional semiconductor integrated circuit device which has the double well structure.

When the formation areas of the P-channel and N-channel transistors 21 and 22 are substantially equal to each other and ¼ as shown in FIGS. 1 and 4, for example, the PN junction area is increased from ¼ to ¾, that is tripled. As the formation areas of the P-channel and N-channel transistors 21 and 22 occupy a smaller proportion of the whole area of the P-type semiconductor substrate 1, the application of the invention attains greater effects.

In this way, when the PN junction area is increased, the PN junction capacitance is increased in proportion to the increase of the area. When a noise is fabricated in the Vcc conductor 3 or the Vss conductor 4, the potential variation of the Vcc conductor 3 or the Vss conductor 4 is easily absorbed by the operation described below. In contrast that the power supply voltage is a constant DC voltage, a noise is due to an abrupt change of a current. When a capacitor is connected between the Vcc conductor 3 and the Vss conductor 4, the current which temporally changes in an abrupt manner is absorbed by the capacitor. A capacitor allows an alternating current to pass through but prevents a direct current from passing through. Therefore, the AC component of the current equivalently flows but the DC component is blocked. Consequently, an influence of a noise exerted on a circuit connected to the Vcc conductor 3 and the Vss conductor 4 is largely reduced, whereby the circuit can be prevented from malfunctioning.

Embodiment 2

Figure 6:
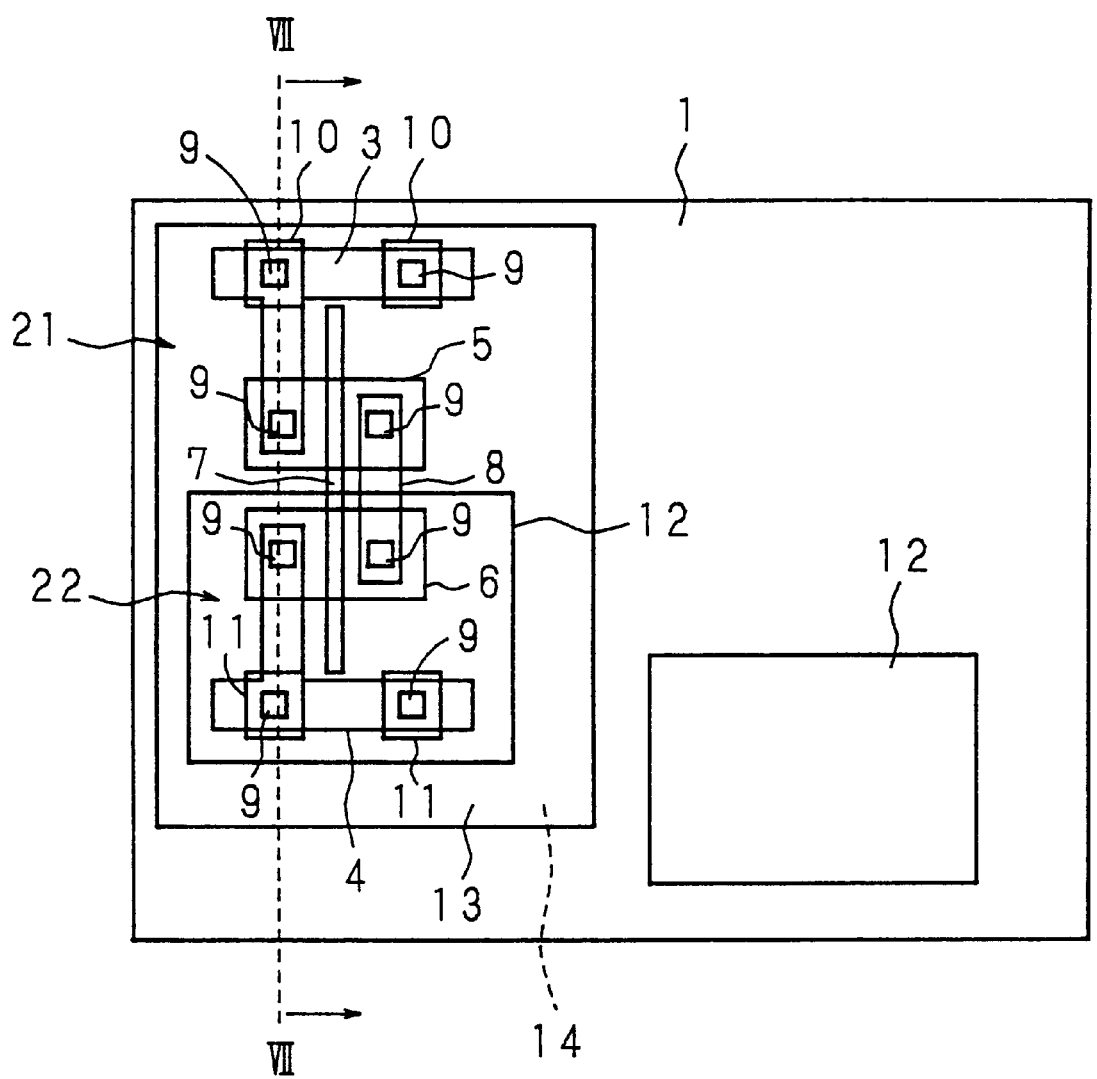
FIG. 6 is a view showing a layout of a semiconductor integrated circuit device of Embodiment 2 of the invention.
Figure 7:
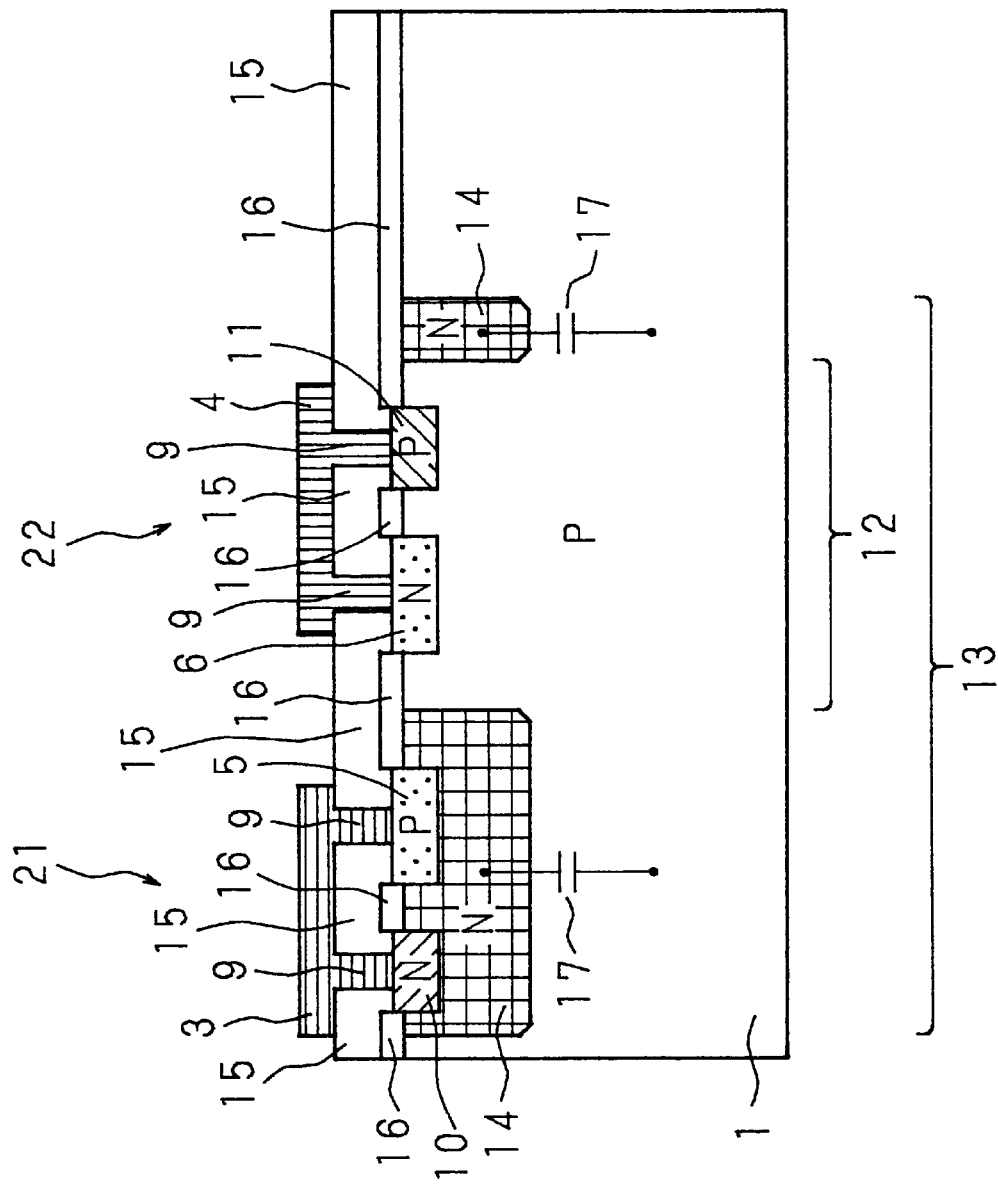
FIG. 7 is a sectional view taken along line VII—VII in FIG. 6.

FIG. 6 is a view showing a layout of a semiconductor integrated circuit device of Embodiment 2 of the invention, and FIG. 7 is a sectional view taken along line VII—VII in FIG. 6. In the embodiment, an N-well designation region 13 is set in the P-type semiconductor substrate 1, and the N-wells 14 are formed in the portion of the N-well designation region 13 excluding the P-type substrate region 12. The other portions are configured in the same manner as those of FIGS. 4 and 5. These portions are designated by the same reference numerals, and their description is omitted.

When the semiconductor integrated circuit device of the embodiment is fabricated, data, which regard the area, that of the desired PN junction capacitance 17 plus that of the P-type substrate region 12, as the N-well designation region 13, and data of the region where the N-channel transistor 22 is to be formed as the P-type substrate region 12 are firstly input. Thereafter, a mask is fabricated by performing a graphic process in such a manner that the N-wells 14 are formed in the whole portion where there exists no data for the P-type substrate region 12 within the N-well designation region 13. The subsequent processes are the same as those of Embodiment 1.

When the junction area between the P-type semiconductor substrate 1 and the N-wells 14 is increased, the PN junction capacitance 17 can be increased, and the power consumption during the operation is increased. In the semiconductor integrated circuit device of the embodiment, the N-well designation region 13 is set in consideration of both the power consumption and the PN junction capacitance 17. Therefore, a noise level can be reduced to a desired level so that a circuit is prevented from malfunctioning and operates within a predetermined range of the power consumption.

In the embodiment, the N-well designation region 13 which defines the outer boundary of the N-wells 14 is designated. Alternatively, the region where the N-wells 14 are not formed, but the P-type semiconductor substrate 1 remains may be designated.

Embodiment 3

Figure 8:
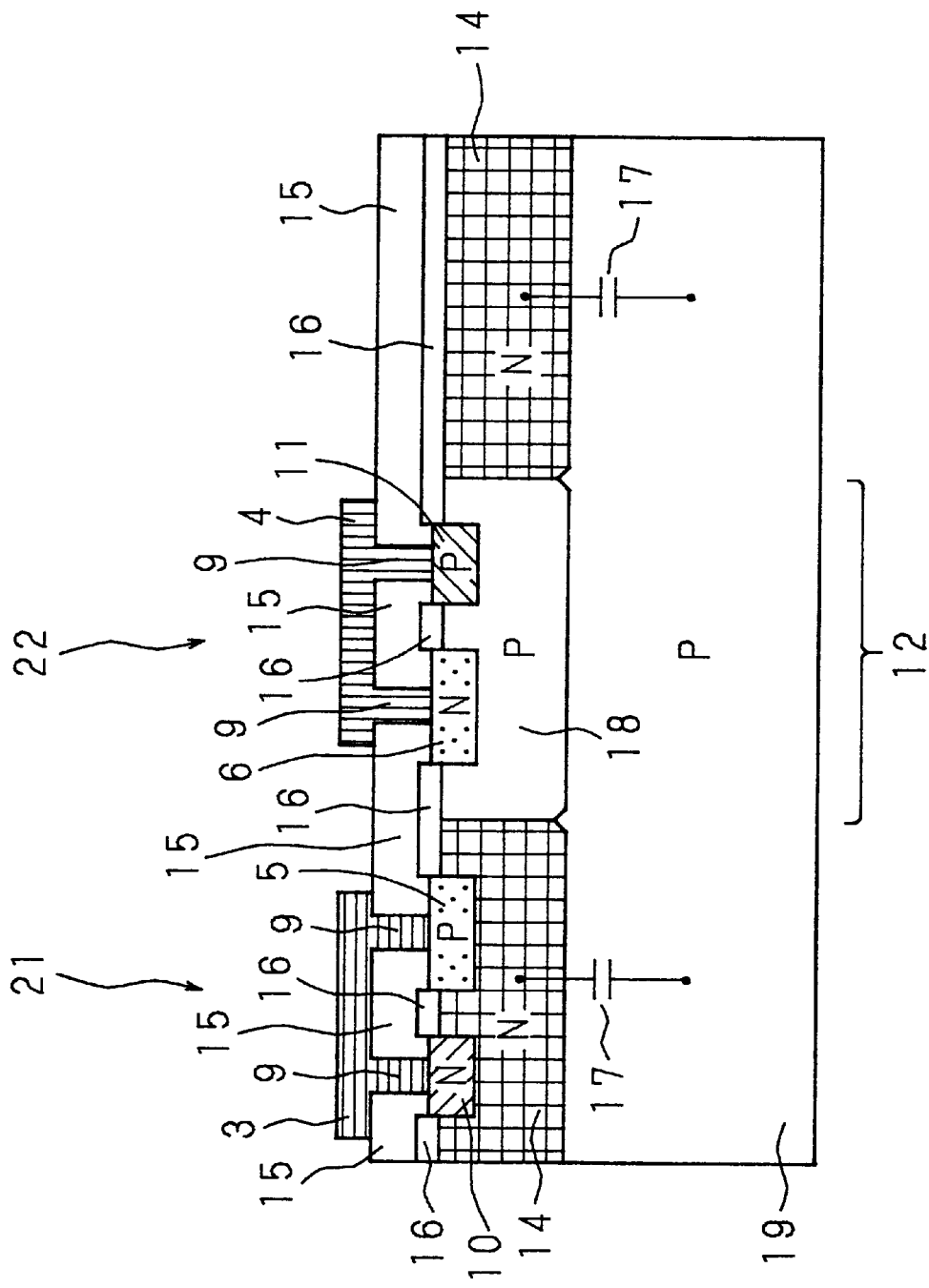
FIG. 8 is a sectional view showing a semiconductor integrated circuit device of Embodiment 3 of the invention.

FIG. 8 is a sectional view showing the structure of a semiconductor integrated circuit device of Embodiment 3 of the invention. The embodiment has the double well structure. The P-well 18 is formed in the region where the N-channel transistor 22 is to be formed in the low-concentration P-type semiconductor substrate 19. The N-wells 14 are formed in the other region. The other portions are configured in the same manner as those of FIG. 5. These portions are designated by the same reference numerals, and their description is omitted.

In the thus configured semiconductor integrated circuit device, since design data for forming the P-well 18 have already been input in the design of the prior art, the P-well 18 is formed on the basis of the design data, and the N-wells 14 are formed in the other portion. Thereafter, elements are fabricated by the same fabrication processes as those of Embodiment 1.

In this way, the invention can be applied also to a semiconductor integrated circuit device having the double well structure. The embodiment can attain the same effects as those of Embodiment 1. The design data of the prior art can be used in the embodiment.

When an N-type semiconductor substrate is used in place of the P-type semiconductor substrate 1, Vcc and Vss are interchanged with each other, and the P type and the N type are interchanged with each other.

As described above, in the semiconductor integrated circuit device of the invention, a semiconductor layer of a second conductivity type is formed in a region excluding a region where a semiconductor element of the second conductivity type is to be formed in a semiconductor substrate of a first conductivity type, and therefore the junction area between the semiconductor substrate of the first conductivity type and the semiconductor layer of the second conductivity type is much larger than that in the prior art, whereby the junction capacitance is increased so that a noise is absorbed to be eliminated. Consequently, the device is prevented from malfunctioning.

When the semiconductor layer of the second conductivity type having an adequate area is formed in a region excluding where the semiconductor element of the second conductivity type is to be formed, it is possible to obtain a desired junction capacitance, and the device can operate with a power consumption in a predetermined range.

In the method of the invention, furthermore, a specific region defining the outer boundary of the semiconductor layer of the second conductivity type is set with adjusting the device so that a desired junction capacitance is obtained and that the increase of the power consumption due to the increase of the junction area is within an allowable range. According to the method, therefore, a semiconductor integrated circuit device in which a noise level and power consumption are within a predetermined range can be fabricated.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor integrated circuit device comprising:

a semiconductor substrate of a first conductivity type; and a CMOS region formed in a main surface of said semiconductor substrate, said CMOS region containing:

a field effect transistor of said first conductivity type formed in a first region of a second conductivity type;

a field effect transistor of said second conductivity type formed in a second region of said first conductivity type; and a semiconductor layer of said second conductivity type formed in a third region, the entire semiconductor layer of the second conductivity type extending from the main surface into said semiconductor substrate outside of said first and second regions abutting said second region.

2. The semiconductor integrated circuit device according to claim 1, wherein the semiconductor layer of the second conductivity type extends from within to outside of the CMOS region.

* * * * *